United States Patent [19]

Jacobson

[11] 3,886,505

[45] May 27, 1975

[54] SEMICONDUCTOR PACKAGE HAVING MEANS TO TUNE OUT OUTPUT CAPACITANCE

[75] Inventor: David Stanley Jacobson, Flemington, N.J.

[73] Assignee: RCA Corporation, New York, N.Y.

[22] Filed: Apr. 29, 1974

[21] Appl. No.: 464,944

[52] U.S. Cl. .............................. 333/84 M; 357/74
[51] Int. Cl. .............................................. H01p 1/00
[58] Field of Search........ 333/84 M; 357/51, 74, 75, 357/80; 174/523, DIG. 3

[56] References Cited

UNITED STATES PATENTS 3,209,291 9/1965 Schneider ........................ 357/74 X
3,825,805 7/1974 Belohoubeck et al. ........... 357/74 X

*Primary Examiner*—Paul L. Gensler
*Attorney, Agent, or Firm*—H. Christoffersen; M. Y. Epstein

[57] ABSTRACT

For shunt tuning the output capacitance of a semiconductor device having an output terminal serially connected to the semiconductor chip through a parasitic inductance within the device envelope, an additional terminal is provided connected through an internal inductor to a point of junction of the output terminal and the parasitic inductance.

6 Claims, 6 Drawing Figures

SEMICONDUCTOR PACKAGE HAVING MEANS TO TUNE OUT OUTPUT CAPACITANCE

This invention relates to high frequency semiconductor devices, and particularly to means for tuning out or resonating the output capacitance of such devices.

One type of high frequency semiconductor device comprises a device envelope or package, a semiconductor chip mounted within the envelope, and three device terminals connected to different ones of the emitter, base, and collector regions of the semiconductor chip. In use of the device, one of the terminals, generally either the emitter or base terminal, is grounded, and a signal is introduced into the device between an input terminal and the ground terminal, and a signal is taken from the device between an output terminal (generally the collector terminal) and the ground terminal.

By convention, the electrical circuits connected to the input and output ends of the semiconductor device have an impedance of 50 ohms, and, for efficiency of signal coupling, the device should also have an input and output impedance of 50 ohms. High frequency, high power semiconductor devices, however, tend to have inherently low input and output impedances, and it is generally the practice to use impedance transformation networks for upwardly transforming the input and output impedance of the device.

Considering the output impedance of the device, this comprises, among other things, the impedance of the semiconductor chip between the collector and ground regions thereof, and the impedance of the collector terminal and the interconnections between it and the chip collector region.

The impedance of the semiconductor chip can be represented as a resistor and a capacitor connected in parallel to one another between the collector and ground terminals, and the impedance of the collector terminal and its interconnections can be represented as an inductance.

As generally known, one effect of the semiconductor chip capacitance, referred to as the "output" capacitance, is to downwardly transform the device output resistive impedance, i.e., reduce the already relatively low resistance associated with the semiconductor chip. To counter this effect, it is a known practice to tune out this capacitance by disposing a resonating circuit within the device envelope in parallel therewith. As explained hereinafter, the resonating circuit of the prior art is preferably disposed within the device envelope for the purpose of improving the device bandwidth capability.

Shortcomings of the use of such a resonating circuit within the device envelope, however, are that it adds cost to the device, and, once included within the device envelope, it tends to fix the characteristics of the device, somewhat limiting the flexibility of the use thereof. The instant invention is directed towards means for providing such resonating circuits, but in a more flexiable and inexpensive manner. In the Drawings.

Figure 4:
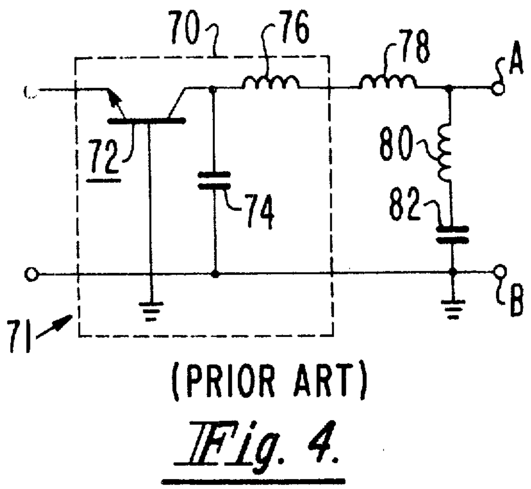
(PRIOR ART) Fig. 4.
Figure 5:
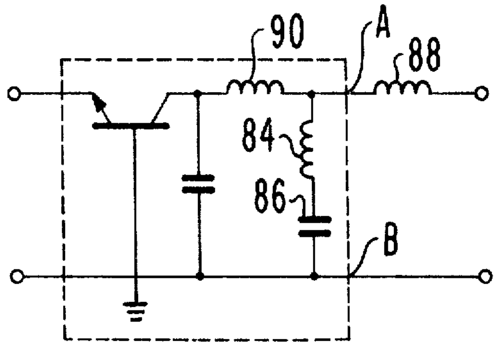
(PRIOR ART) Fig. 5.
Figure 6:
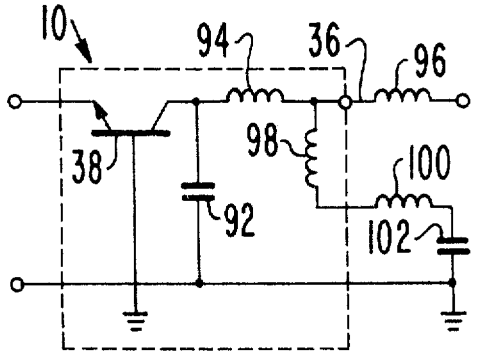

FIGS. 4, 5, and 6 are schematic diagrams showing two prior art arrangements and the arrangement of the instant invention, respectively, for providing output resonating and tuning circuits.

While not limited thereto, the instant invention has utility, and is illustrated herein, in a high frequency semiconductor device using an envelope or package of the type shown in U.S. Pat. No. 3,748,544, issued to S. Noren on Feb. 14, 1972, the disclosure of said patent being incorporated herein. This patent provides an extensive description of the device envelope and of means to fabricate it; accordingly, only a brief description of the device envelope is herein provided.

Figure 1:
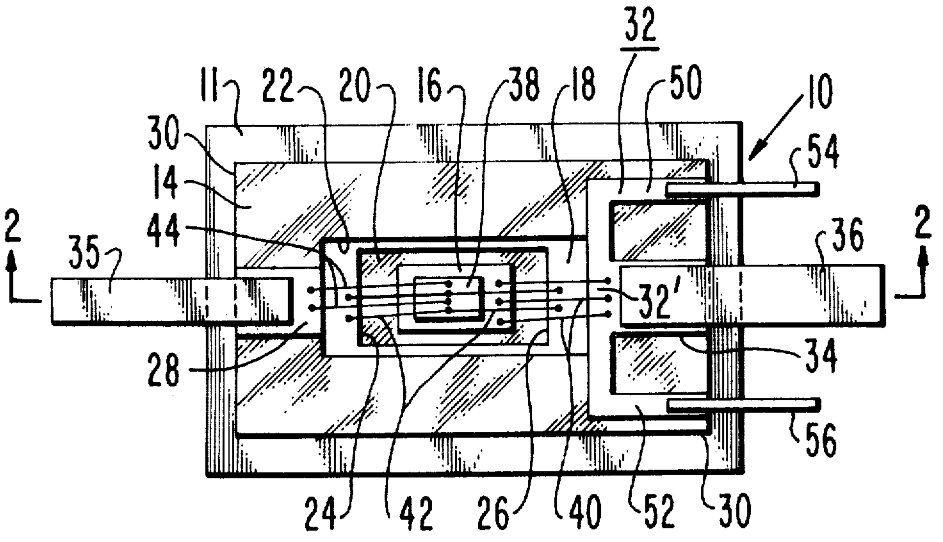
FIG. 1 is a plan view of a portion of a device made in accordance with this invention.
Figure 2:
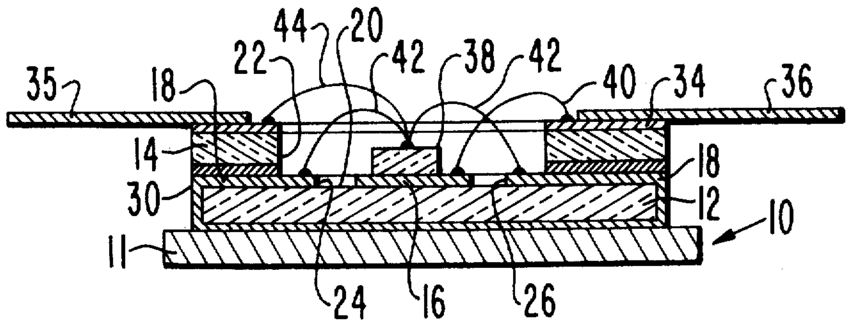
FIG. 2 is a cross-sectional view taken along line 2—2 of FIG. 1.

As shown in FIGS. 1 and 2, a device 10 in accordance with the instant invention comprises a header member 11 of metal, e.g., copper, a support member 12 of insulating material, e.g., ceramic, bonded to the header member 11, as by brazing, and an apertured member 14 also of insulating material bonded to the support member 12, as by brazing. The support member 12 has two metallized areas 16 and 18 (FIG. 2) thereon, e.g., of gold plated molybdenum or molybdenum manganese, the area 16 being of generally rectangular shape (FIG. 1) and disposed generally centrally of the upper surface 20 of the member 12, and the area 18 being spaced from the area 16 and covering, in this embodiment, substantially all the remaining surfaces of the member 12.

The aperture 22 through the member 14 exposes at least a portion of the central area 16 along with portions 24 and 26 of the area 18 on opposite sides of the area 16.

An elongated metallized area 28 extends between the outer edge 30 of the apertured member 14 and the aperture edge, and a metallized area 32 is disposed on the other side of the aperture 22 including an elongated portion 34 extending between the outer edge 30 and the aperture edge. An input terminal 35 is secured to the area 28, as by brazing, and an output terminal 36 is similarly secured to the elongated portion 34 of the area 32.

A semiconductor transistor chip 38 of known type, including emitter, base, and collector regions, is mounted, as by brazing, to the central area 16 on the member 12. In this embodiment of the invention, the collector region of the chip 38 is electrically connected to the area 16 through the bottom surface of the chip, and thence to the output terminal 36 via bond wires 40 extending between and bonded to the matallized areas 16 and 34. The base region of the chip is electrically connected to each portion 24 and 26 of the surrounding area 18 by several bond wires 42, and the emitter region of the chip is electrically connected to the elongated area 28 on the member 14 by several bond wires 44 and thus to the input terminal 35. While not so limited, the illustrative device 10 is thus of the common or grounded base type. The header 11 of the device is a third terminal which is connected to the metallized area 18 on the member 12, and thus to the base region of the chip 38 bia the bond wires 42.

To the extent so far described, the device 10 is quite similar to known devices. The three members 11, 12 and 14, along with a closure member (not shown) mounted on the member 14 and closing the aperture 22 therethrough, comprise a portion of a known type of device envelope including three terminals 11, 35 and 36 by means of which the device 10 can be electrically connected into a circuit.

The device 10 differs from known devices, however, in that the metallized area 32 on the member 14 includes (FIG. 1) two L-shaped portions or paths 50 and 52 extending away from a central portion 32' of the area 32 (from which the elongated portion 34 also extends) first along the edge of the aperture 22 and then outwardly to the outer edge 30 of the member 14 where two additional terminals 54 and 56 are bonded thereto, respectively. The purpose of these structural differences from the prior art devices is as follows.

Figure 3:
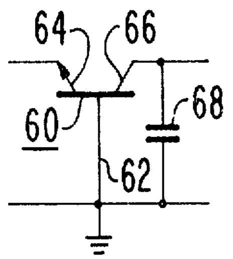
FIG. 3 is a schematic diagram showing the output capacitance associated with a transistor semiconductor chip.

As previously explained, associated with the semiconductor chips of devices of the type herein described is an "output" capacitance. In a bipolar semiconductor chip, for example, with a collector output region and a grounded base region, this capacitance comprises the junction capacitance of the reverse biased collector-base junction, and the capacitance between the base connected metallized pattern on the surface of the chip and the underlying collector region. The existence of such "output" capacitances in devices of the type shown herein is known. A schematic diagram showing such an output capacitance is provided in FIG. 3. Thus, with a transistor chip 60 having a grounded base 62, an input emitter 64, and an output collector 66, an output capacitance is present which is represented in FIG. 3 by the capacitor 68 between the collector 66 and the grounded base 62. As previously described, the presence of this output capacitor 68 is generally undesirable as tending to downwardly transform the resistive component of the output impedance of the device.

To counteract the effect of this capacitor, it is a known practice to tune it out by resonating it with a shunt inductance, the shunt inductance being part of a shunting circuit comprising a serially connected inductance and a capacitor connected between the device output electrode and the device common or ground electrode. By resonating the output capacitance with the shunting inductance, the reactance in parallel with the chip becomes infinite, thus reducing the downward transformation of the device resistive impedance and reducing the amount of upward impedance transformation required to raise the device output impedance to the desired level. This is generally desirable since, as known, the greater the amount of upward transformation required, the more narrow is the bandwidth capability of the device. The purpose of the capacitor in the shunting circuit is to d.c. isolate the collector region of the chip from the base region thereof.

One means known in the prior art to accomplish such shunt tuning is to dispose the entire shunting circuit externally of the device envelope using conventional circuit connecting means. This is shown schematically in FIG. 4 in which the envelope 70 of a prior art device 71 is indicated by a dashed line square. Thus, within the envelope 70 is a transistor chip 72 with its output capacitor 74. Also within the envelope 70 is an output series inductor 76 which represents the inductance associated with the various connector means between the transistor chip collector region and an inductor 78 representing the inductance of the device output terminal. Thus, for example, in the illustrative embodiment shown in FIGS. 1 and 2, the internal series inductor is that inductance associated with a portion of the metallized area 16 on the member 12 on which the chip 38 is mounted, the bond wires 40, the elongated metallized portion 34 of the area 32, and the portion of the output terminal 36 within the device envelope.

The known external shunting circuit for tuning out the output capacitor 74 of the prior art device 71 (FIG. 4) comprises a shunting inductor 80 and a blocking capacitor 82 connected between the device output terminal 78 and the point of ground or common potential. The output of the device is thus across the points A and B.

A disadvantage of the use of external shunting circuits is that, considering the point A as a tap of an impedance dividing circuit, the presence of the inductance 78 of the output terminal reduces the effective output impedance at the device output A-B, and requires a corresponding higher upward transformation to achieve the desired output impedance. As previously noted, the higher the upward impedance transformation required, the lower the device bandwidth capability.

An alternate known approach is to dispose the shunting circuit internally of the device envelope. A schematic diagram of such a device is shown in FIG. 5 in which a shunting inductor 84 and a blocking capacitor 86 are disposed within the device envelope, the shunting circuit being serially connected between the ground connection and a point of junction between an inductance 88 associated with an output terminal of the device and an internal series inductor 90.

An advantage of this arrangement, as compared with the arrangement shown in FIG. 4, is that at the points A and B of the device, the output terminal inductance does not operate to reduce the effective impedance of the device, and, indeed, the inductance 88 can be used as a part of a following upward impedance transforming network.

A disadvantage of the use of internal shunting circuits, however, is that, as previously noted, it adds extra cost to the device, and, since the shunting circuit is sealed within the device envelope and no separate connection is provided thereto, the optimum operating frequency and bandwidth characteristics of the device as affected by the shunt tuning circuit are fixed and not subject to being altered or modified by the user of the device.

A schematic diagram for the device 10 shown herein is provided in FIG. 6. As in the prior art devices, the schematic diagrams of which are shown in FIGS. 4 and 5, the device 10 includes an output capacitor 92 disposed between the collector and base regions fo the chip 38, an internal series inductor 94 representing the inductances associated with the electrical path between the chip 38 and the output terminal 36, and an external inductor 96 representing the inductance associated with the output terminal 36.

As shown in FIG. 1, the two metallized portions or paths 50 and 52 connect with the metallized portion 34 closely adjacent to the point of contact therewith by the bond wires 40 and the output terminal 36. While not exact, owing to the distributed inductances associated with these various members, the inductance associated with the paths 50 and 52 (in parallel with each other) can be reasonably accurately represented as an internal inductor 98 (FIG. 6) connected internally of the device envelope at the junction between the inductors 94 and 96. The inductance of the two terminals 54 and 56, also in parallel with each other, are represented by an inductor 100 external to the device envelope and serially connected to the internal inductor 98.

The two inductors 98 and 100, one internal and the other external to the device envelope, comprise the inductance of a shunting circuit. A d.c. blocking capacitor 102 shown in FIG. 6 can be provided by connecting each terminal 54 and 56 to external capacitors (not shown) using conventional circuit techniques.

An advantage of the inventive arrangement is that since the inductor 100 is external to the device 10, its inductance value can be adjusted as desired in the upward direction. That is, while it is not possible to completely eliminate the inductor 100, the inductance thereof can be made as high as desired. Thus, within limits determined by the minimum obtainable inductance of the conductor 100, such device characteristics as the power output, power gain and collector efficiency can be adjusted as desired over the optimum frequency range of the device. Also, since the blocking capacitor 102 is disposed outside the device 10, the device itself is less expensive than prior art devices using internal shunting circuits.

Of significance is that while the device 10 is somewhat similar to the prior art arrangement shown in FIG. 4 in that a device terminal (i.e., the terminals 54 and 56) and its associated inductance is disposed externally of the device and serially of the shunting circuit, this external inductance has not adverse affect on the bandwidth characteristics of the device as is the case with devices using external impedance matching circuits. This follows because the shunting circuit, including the portions thereof external to the envelope, is connected within the device envelope interiorly of the output terminal 36, i.e., the inductance associated with this terminal is not in series with the shunting circuit and thus does not operate to reduce the effective output impedance of the device.

As previously noted, the inductance of the shunt inductor of the shunting circuit comprises the inductances of the inductors 98 and 100, the former being the inductances associated with the metallized paths 50 and 52 (FIG. 2) on the member 14. Although not illustrated, it will be apparent to workers in these arts that the inductance of the paths 50 aand 52 can be varied over a wide range by varying the shape and dimensions of these paths.

Also, both for reasons of symmetry of loading of the device, and for obtaining a low inductance associated with the internal portions of the tuning circuit, the two terminals 54 and 56 are preferably provided, these terminals being disposed on opposite side of the output terminal 36 and being connected in parallel to one another.

What is claimed is:

1. A high frequency semiconductor device comprising:

an envelope, a transistor chip mounted within said envelope, first, second, and third terminals electrically connected to different portions of said chip, said first and said second terminals providing means whereby an electrical signal can be introduced into said device, and said second and said third terminals providing means whereby an electrical signal can be extracted from said device, said third terminal extending exteriorly from said envelope and serially connected to said chip through a first inductance within said envelope, and a fourth terminal separate from said second terminal extending exteriorly from said envelope and serially connected through a second inductance within said envelope to a point of junction between said third terminal and said first inductance.

2. A device as in claim 1 including:

a support means on which said chip is mounted, said third terminal being mounted on said support in spaced relation with said chip, and first conductive means extending between and electrically connecting said chip to said third terminal, said first conductive means comprising said first inductance.

3. A device as in claim 2 wherein:

said fourth terminal is mounted on said support means in spaced relation with said point of junction of said first conductive means and said third terminal, and including second conductive means extending between and electrically connecting said fourth terminal to said point of junction, said second conductive means comprising said second inductance.

4. A device as in claim 3 wherein said first conductive means comprises at least one bond wire, and said second conductive means comprises a metallized path on said support member.

5. A device as in claim 4 including two fourth terminals disposed on opposite sides of said third terminal and connected to said point of junction by different metallized paths.

6. A device as in claim 5 including a patterned metallized area on said support means in spaced relation with said chip, said metallized area including three elongated portions extending from a central portion of said area towards edge regions of said support means, each of said third and said two fouth terminals being bonded to different ones of said elongated portions adjacent to said edge regions, and said bond wire being bonded to said central portion.

* * * * *